United States Patent [19]
Barbee et al.

[11] Patent Number: 5,451,289
[45] Date of Patent: Sep. 19, 1995

[54] FIXTURE FOR IN-SITU NONCONTACT MONITORING OF WET CHEMICAL ETCHING WITH PASSIVE WAFER RESTRAINT

[75] Inventors: Steven G. Barbee, Dover Plains; Tony F. Heinz, Chappaqua; Leping Li, Poughkeepsie; Eugene H. Ratzlaff, Hopewell Junction, all of N.Y.

[73] Assignee: International Business Machines Corporation, Armonk, N.Y.

[21] Appl. No.: 269,859

[22] Filed: Jun. 30, 1994

[51] Int. Cl.⁶ .......................................... H01L 21/306
[52] U.S. Cl. ...................................... 216/59; 156/345; 204/129.2; 216/84
[58] Field of Search ........................ 156/626, 627, 345; 204/29.2, 297 R

[56] References Cited

U.S. PATENT DOCUMENTS

| | | | |
|---|---|---|---|
| 2,933,675 | 4/1960 | Hoelzle | 324/30 |
| 4,497,699 | 2/1985 | de Wit et al. | 204/129.2 |
| 4,793,895 | 12/1988 | Kaanta et al. | 156/627 |
| 4,995,939 | 2/1991 | Ferenczi et al. | 156/627 |
| 5,081,421 | 1/1992 | Miller et al. | 324/671 |

FOREIGN PATENT DOCUMENTS 55-46568  4/1980  Japan ............................ H01L 21/88

OTHER PUBLICATIONS

Goubau, W. M., "Capacitive Etch Rate Monitor for Dielectric Etching", IBM Technical Disc. Bulletin vol. 31, No. 1, Jun. 1988, 448–449.
Liu et al., "Resistance/Capacitance Methods for Determining Oxide Etch End Point", IBM Technical Disc. Bulletin vol. 16, No. 8, Jan. 1974, 2706–2707.
Hoekstra, J. P., "Establishing End Point During Delineation Process", IBM Technical Disc. Bulletin vol. 16, No. 6, Nov. 1973, 1717–1720.
Bassous et al., "An In-Situ Etch Rate Monitor Controller", IBM Technical Disc. Bulletin vol. 20, No. 3, Aug. 1977, 1232–1234.

Primary Examiner—R. Bruce Breneman
Assistant Examiner—Joni Y. Chang
Attorney, Agent, or Firm—Michael J. Balconi-Lamica; Alison D. Mortinger

[57] ABSTRACT

A fixture for in-situ chemical etch monitoring of an etching process during etching of at least one wafer contained in a wafer carrier is disclosed. The fixture comprises a set of primary guide members for engaging and guiding a front portion of the wafer carrier. A set of rear guide members engages and guides a rear portion of the wafer carrier. A set of electrode arms is included for receiving a respective electrode and corresponding electrode wire thereon. A mounting plate establishes a prescribed spacing of the set of primary guide members with respect to the set of electrode arms. A means for self-locking the first wafer contained in the wafer boat is connected to the mounting plate and further positioned in a prescribed manner with respect to the set of primary guide members and the set of electrode arms. Lastly, a connecting means connects the mounting plate, the set of primary guide members, and the set of electrode arms to the set of rear guide members, whereby insertion of the wafer boat into the fixture establishes a prescribed distance between the set of electrode arms and the first wafer, and further wherein the first wafer is passively fixed by the self-locking means.

1 Claim, 5 Drawing Sheets

FIXTURE FOR IN-SITU NONCONTACT MONITORING OF WET CHEMICAL ETCHING WITH PASSIVE WAFER RESTRAINT

BACKGROUND OF THE INVENTION

1. Field of the Invention

This invention generally relates to a method and apparatus for monitoring the etching condition of a chemical etching process, and more particularly, to a fixture for use in a contactless real-time in-situ method and apparatus.

2. Discussion of the Related Art

Etch rates and etch end points must be carefully monitored and controlled in order to end etching processes at a desired time. In semiconductor processing, inadequate or excess etching time can result in undesirable film patterning. For instance, for semiconductor devices having film layers or features in the micron and sub-micron range, an inadequate etch or an excess etch would result in the insufficient removal or the excess removal of a desired layer. Insufficient removal of a desired layer can result in an undesired electrical open or electrical short when the desired layer to be removed is an insulator or a conductor, respectively. Additionally, if the etch is in excess, undercutting or punch through can occur resulting in poorly defined film patterning or total lift-off. Inadequate or excess etching further leads to undesirable reliability problems in the subsequently fabricated semiconductor device. As a semiconductor wafer is extremely expensive due to many processing steps involved in the making thereof, the need to critically control the etching end point in an etching process is highly desirable.

An etch end point must be accurately predicted and/or detected to terminate etching abruptly. Etch rates, etch times, and etch end points are difficult to consistently predict due to lot-to-lot variations in film thickness and constitution, as well as etchant temperature, flow, and concentration variability. That is, an etch rate is dependent upon a number of factors, which include, etchant concentration, etchant temperature, film thickness, and the film characteristics. Precise and strict control of any of these factors can be very expensive to implement, for example, concentration control.

Some currently used etch rate end point determination techniques depend on indirect measurement and estimation techniques. Some etch monitoring techniques have relied on external measurements of film thickness followed by etch rate estimation and an extrapolated etch end point prediction. However, etch rates may vary due to batch-to-batch differences in the chemical and physical characteristics of the film or the etchant. These extrapolation methods are inadequate.

As an alternative to indirect measurements and estimation techniques, real-time in-situ monitoring is preferred. Some in-situ techniques monitor the etch rate of a reference thin film. This may require additional preparation of a monitor wafer containing the reference thin film or a suitable reference may be unavailable. Still other techniques require physical contact of electrical leads with the wafer being etched and electrical isolation of those leads and associated areas of the wafer from the etchant. This presents problems associated with contamination, contact reliability and reproducibility, and the physical constraints which affect ease of use in manufacturing or automation.

CROSS-REFERENCE TO COPENDING APPLICATIONS

A method and apparatus which provides non-contact, real-time, in-situ monitoring of an etching condition of a wafer being etched is disclosed in applicants' copending U.S. patent application Ser. No. 07/985,413, filed Dec. 4, 1992, entitled "Contactless Real-Time In-Situ Monitoring of a Chemical Etching Process," assigned to the assignee of the present invention (attorney docket FI9-92-152), the disclosure of which is hereby incorporated by reference into the present application. Patent application Ser. No. 07/985,413 describes a method and apparatus for the contactless, real-time, in-situ monitoring of a chemical etching process during etching of a wafer in a wet chemical etchant bath, wherein two conductive electrodes are proximate to but not in contact with the at least one wafer, and further wherein the two electrodes are positioned on opposite front/back sides of the wafer. Although this method and apparatus provide in-situ etch monitoring, it presents difficulties for automation, i.e., in application to automated etch tools. The electrodes are positioned close to the wafer to optimize sensitivity, which in turn, increases the possibility of undesired contact with the wafer and ensuing wafer damage. Furthermore, the in-situ monitoring method is susceptible errors resulting from wafer movement induced by the convection of circulating etchant. As a result, the wafer and the electrodes must be placed and kept in a mutually fixed positions. Thus, a retro-fittable fixture compatible with robotics and which provides a reproducible and safe wafer restraint is highly desirable. In addition, decoupling of electrodes from the wafer carrier is critical for independent motion and movement of the wafer carrier, which is critical to automation.

In addition to the above mentioned copending U.S. patent application, six additional copending U.S. patent applications, filed on even date herewith, entitled variously: "Minimizing Overetch During A Chemical Etching Process", "Real Time Measurement Of Etch Rate During A Chemical Etching Process", "Measuring Film Etching Uniformity During A Chemical Etching Process", "Contactless Real-Time In-Situ Monitoring Of A Chemical Etching Process", "Method And Apparatus For Contactless Real-Time In-Situ Monitoring Of A Chemical Etching Process", "Method And Apparatus For Contactless Real-Time In-Situ Monitoring Of A Chemical Etching Process", assigned to the assignee of the present invention (attorney docket numbers FI9-93-035, FI9-93-036, FI9-93-037, FI9-93-038, FI9-94-053, FI9-94-055, respectively), describe improvements to the method and apparatus for contactless, real-time, in-situ monitoring of chemical etching disclosed in the 07/985,413 application. The disclosure of the six aforesaid copending applications is also hereby incorporated by reference into the present application.

SUMMARY OF THE INVENTION

An object of the present invention is to overcome the problems in the art discussed above.

Another object of the present invention is to provide a retro-fittable fixture compatible with robotics.

Yet another object of the present invention is to provide a retro-fittable fixture compatible with existing automated etch tools.

Yet another object of the present invention is to provide a fixture having passive, reproducible and safe wafer restraint.

According to the present invention a fixture for in-situ chemical etch monitoring of an etching process during etching of at least one wafer contained in a wafer carrier comprises a set of primary guide members for engaging and guiding a front portion of the wafer carrier. A set of rear guide members engages and guides a rear portion of the wafer carrier. A set of electrode arms are provided for receiving a respective electrode and corresponding electrode wire thereon. A mounting plate establishes a prescribed spacing of the set of primary guide members with respect to the set of electrode arms. A means for self-locking the first wafer contained in the wafer boat is connected to the mounting plate and further positioned in a prescribed manner with respect to the set of primary guide members and the set of electrode arms. Lastly, a connecting means connects the mounting plate, the set of primary guide members, and the set of electrode arms to the set of rear guide members, whereby insertion of the wafer boat into the fixture establishes a prescribed distance between the set of electrode arms and the first wafer, and further wherein the first wafer is passively fixed by the self-locking means.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings in which like reference numerals are carried forward, and in which.

DETAILED DESCRIPTION OF THE PREFERRED EMBODIMENTS

Figure 1:
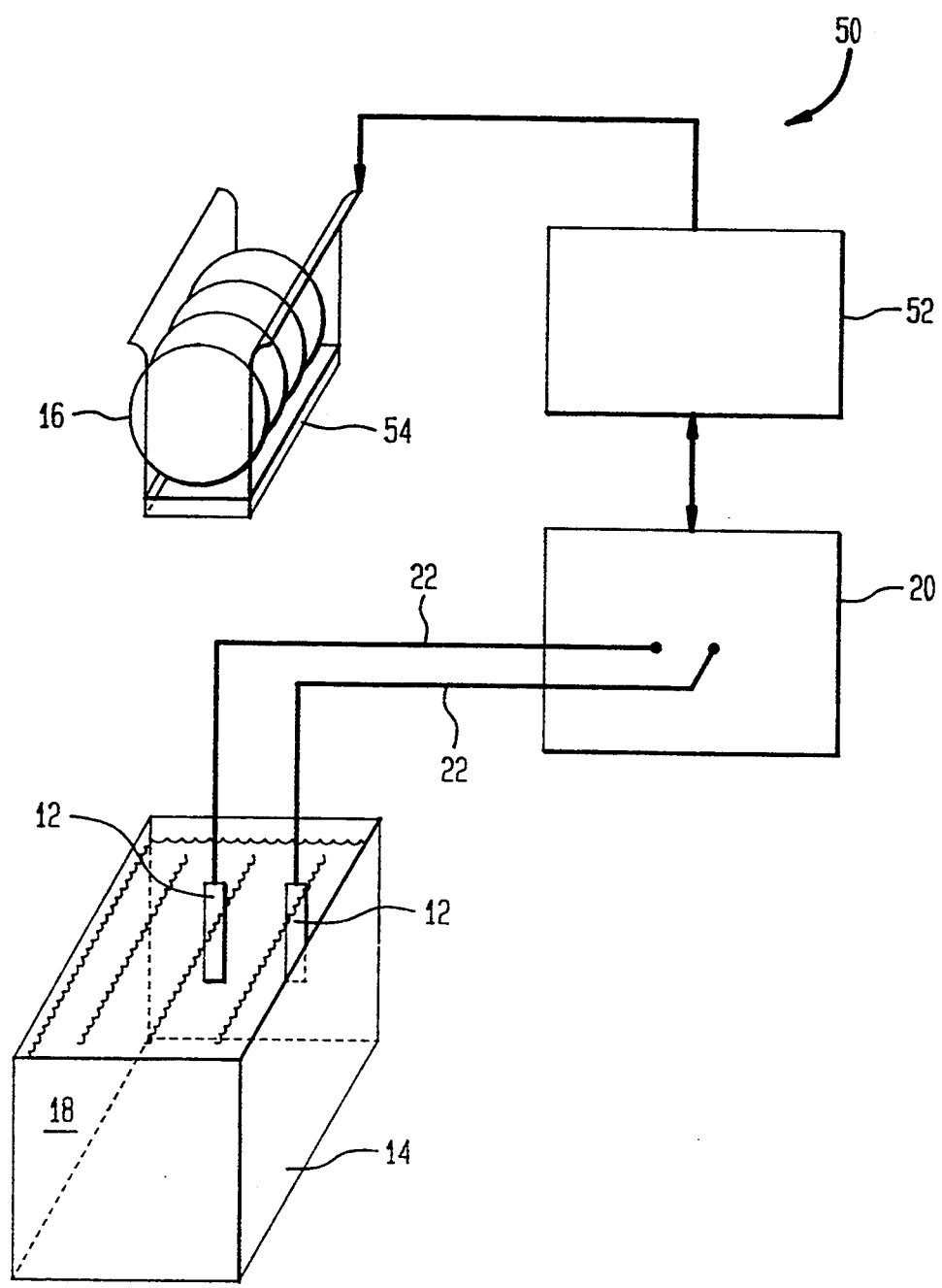
FIG. 1 shows an etch station having in-situ monitoring of a chemical etching process.

The present invention presents a fixture well suited for impedance monitoring in a wet chemical etchant bath. The fixture is compatible with robotic automation and can be retro-fit into existing etch tools. The present invention incorporates features to passively, reproducibly, and safely restrain a wafer in a desired position proximate to measurement electrodes during an etching operation.

In the description to follow, the present invention shall be described in conjunction with its use in an etch station 50 incorporating contactless real-time in-situ monitoring of etch processing. The etch station 50 includes a control means 52, the control means 52 being responsive to an electrical characteristic monitoring means 20. The control means 52 comprises, for example, a computer or programmable controller, in conjunction with any suitable mechanism, such as a robotic arm and a wafer carrier 54, for raising and lowering a wafer 16 into and out of a bath of wet chemical etchant 18. Two conductive electrodes 12 are proximate to but not in contact with the at least one wafer 16 contained in wafer boat 54. Signal lines 22 connect respective electrodes 12 to electrical characteristic monitoring means 20. Control means 52 thus controls the placement of wafer 16 into and out of the bath of wet chemical etchant 18 in response to the sensing of a prescribed etching condition or conditions by the electrical characteristic monitoring means 20. The etch station thereby provides etching process control. Etch stations, robotic arms, and wafer carriers are well known in the art.

Figure 2:
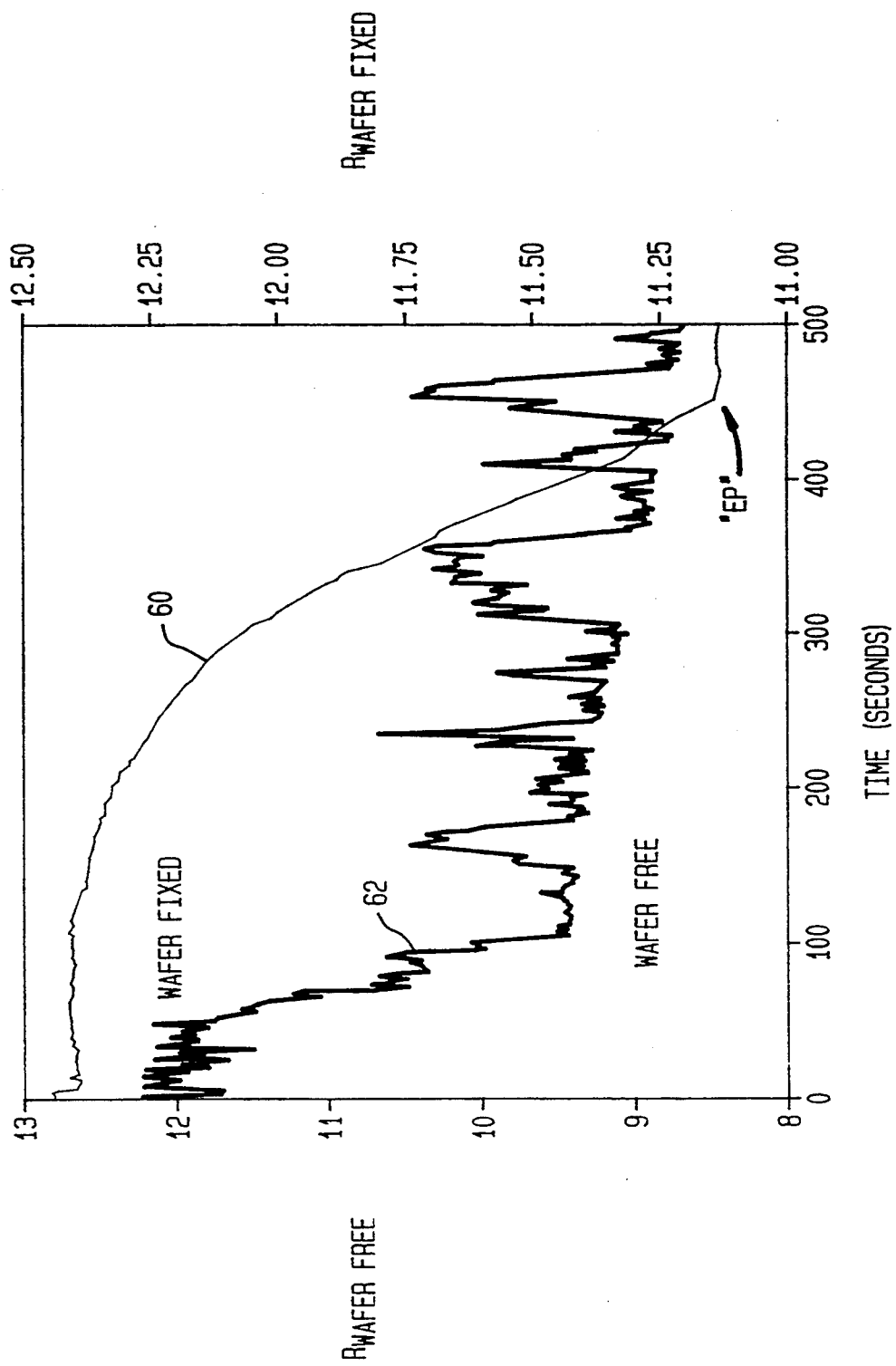
FIG. 2 shows a graph representative of a monitored reactance for a wafer fixed within an etchant bath and a monitored reactance for a wafer not securely fixed within (i.e., free) an etchant bath using an etch station as shown in FIG. 1.

Making reference now to FIG. 2, a graph is shown which is representative of an effect upon the monitoring of an electrical characteristic as a result of whether or not the wafer being monitored is stationary or the wafer has freedom to move during an etching process. As can be seen by the graph, the measured signal, indicated by numeral 60, is indicative of a wafer being fixed during the etching thereof resulting in a relatively noise-free measurement signal. An etching end point identified by "EP" thereon is easily detected. In contrast, the reactance signal, indicated by numeral 62, is indicative of a wafer being mobile or free to move during the etching thereof due to etchant fluid convection resulting in an extremely noisy and erratic measurement signal. A corresponding etching end point is totally masked by the noise, resulting in a useless etching monitor curve.

Figure 3:
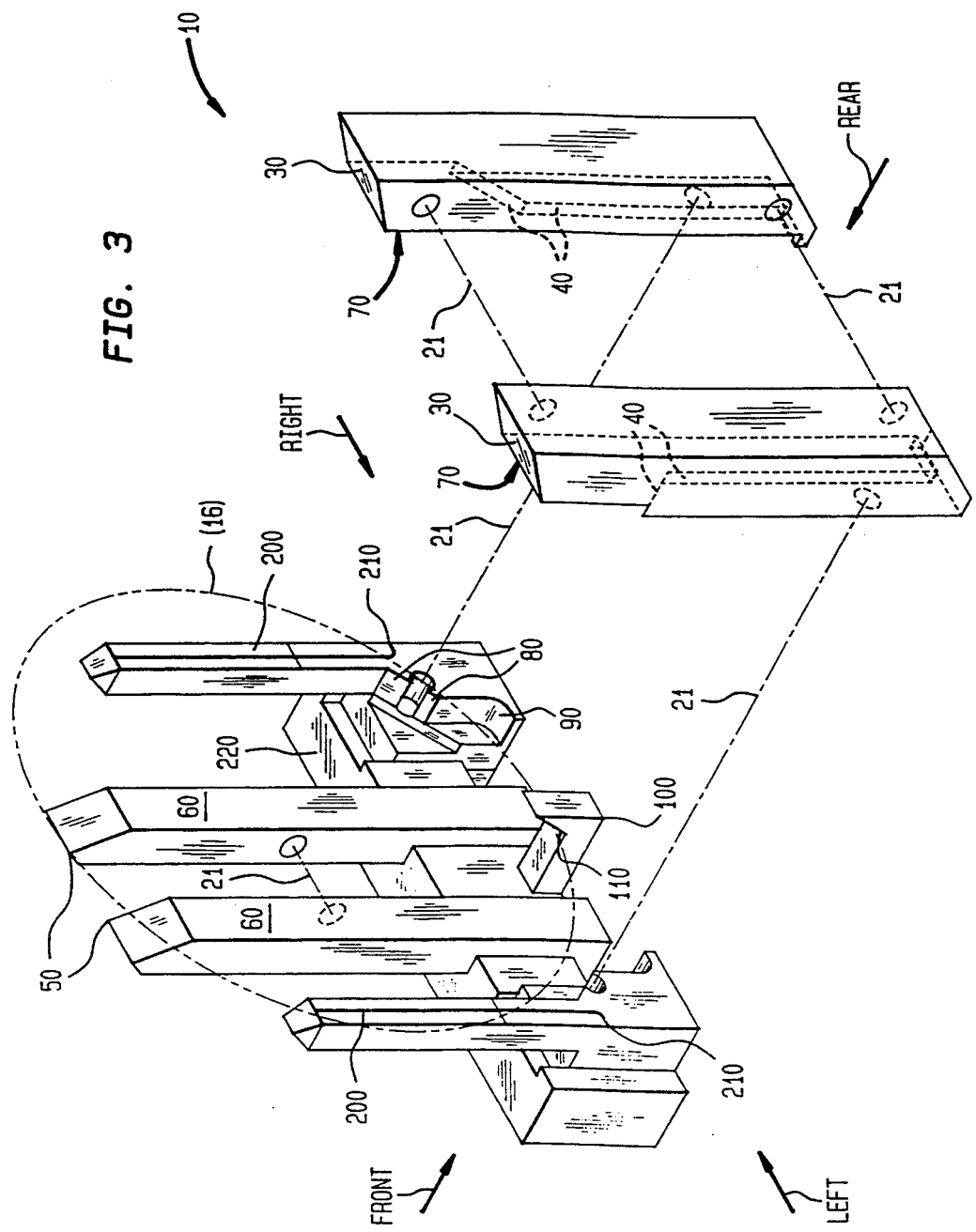
FIG. 3 shows a fixture according to the present invention.

Referring now to FIG. 3, fixture 10 is constructed to enable it to be substantially securably fixed or fitted within the bottom of a wet etch tank. Fixture 10 is further constructed to be compatible with the placement and removal of a wafer carrier 54 by a robotic arm (not shown). Such a wafer carrier may comprise, for example, a common wafer carrier such as part no. A192-81M commercially available from Fluoroware Inc. of Chaska, Minn. Alternatively, fixture 10 may be constrained by suitable means to enable movement within a defined region of the etch tank in the horizontal plane such that fixture 10 self-registers to the placement and removal of the wafer carrier to and from the etchant bath.

Broken lines 21 of FIG. 3 represent locations for cylindrical rod members for interconnecting respective component parts as shown and as will be discussed below. The rod members preferably comprise non-reacting and non-contaminating, and relatively rigid materials. All other component parts are preferably constructed from a chemically inert material, such as a chemically inert polymer, and more particularly, delrin or teflon. Electrodes and wires (not shown in FIG. 3) preferably comprise inert conductive material, the inert conductive material further being insensitive to the etchant used and still further being non-contaminating to the wafer or workpiece being etched. Such an inert conductive material comprises, platinum, for example.

Fixture 10 allows for appreciable variance or error in the robotic arm position reproducibility during placement and removal of the wafer carrier to and from the etchant bath. This is made possible by the use of guide members (as will be further discussed below) which register the wafer carrier to the fixture. Guide members provide registration not only in the horizontal plane, but also limit the amount of front-to-back tilt and flexure of the wafer carrier. Tilt and flexure is a characteristic which results when a wafer carrier becomes flexible at high temperatures. That is, as the wafer carrier is held at a front portion thereof, the rear end thereof subsequently sags with the added weight of the wafers contained therein.

Fixture 10 comprises rear guide members 30 which are characterized by forward sloping surfaces at the tops thereof to steer or direct the wafer carrier forward as it descends upon fixture 10. Guide members 30 also center the wafer carrier left-to-right, and vise-versa, into the fixture 10 by means of respective centering guide surfaces 40. Fixture 10 further includes front guide members 50, the front guide members 50 being characterized by angled or sloped surfaces at the tops thereof to direct the carrier forward during placement of the wafer carrier into fixture 10. The distance between rear guide surfaces 70 of rear guide members 30 and front guide surfaces 60 of front guide members 50 is slightly more than the maximum length dimension tolerance of the wafer carrier. This distance limits tilt and flexure of the wafer carrier while the carrier is positioned within guide members 30 and centering guide surfaces 40, thereby causing the wafer carrier and wafers contained therein to enter and exit the fixture 10 reproducibly. Furthermore, front and rear guide surfaces 60 and 70, respectively, enable any wafers contained within the wafer carrier to remain in a substantially vertical orientation. Guide surfaces 80 and 90 (a right side thereof is shown in FIG. 3, whereas a left side is hidden in FIG. 3) also guide and center a front portion of the wafer carrier, from left-to-right and vise-versa.

Figure 4:
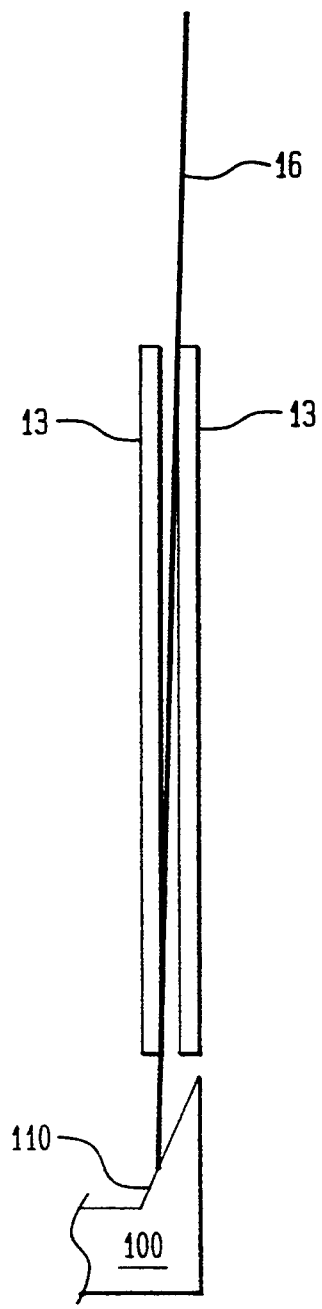
FIG. 4 shows a side view of the passive restraint feature of the fixture of the present invention.

Referring now to FIGS. 3 and 4, as the wafer carrier assumes its registered position in the fixture 10, a wafer 16 in a front most slot of the wafer carrier becomes wedged in place. A wedge 100 "pushes" the wafer 16 up from the base of the carrier as the carrier descends. Under the force of the weight of the wafer 16, the angle surface 110 of the wedge 100 displaces the wafer 16 forward, passively locking it against angle surface 110 and guides 13 of the wafer carrier (see FIG. 4).

Electrodes (not shown) are received into electrode arms 200. Electrodes are preferably rectangular, having dimensions corresponding to the dimensions of an upper face portion of electrode arm 200. Channels 210 allow wire leads of the electrodes be embedded within a surface of electrode arms 200 and further to exit from the electrode arms 200 at a suitable position and location. The wafer carrier is directed by guides 30 and 50 to permit the electrode arms 200 to enter the carrier through holes in a bottom portion of the wafer carrier. Mounting plate 220 completes the integration of the electrode arms 200 and guides 50, that is, mounting plate 220 provides suitable mechanical connection between the component parts 200 and 50. The automatic registration of the wafer carrier and immobilization of wafer 16 create the desired spatial orientation of the wafer 16 and electrode arms 200. The electrodes are thereby located close to the wafer 16 in an automatic fashion without any risk of damage to the wafer. The wafer 16 is thereby passively and safely fixed in registration to the electrodes. Fixture 10 thus advantageously provides the ability for embedded electrodes having corresponding lead wires to be decoupled from the wafer carrier. This further advantageously enables simple retrofitting to existing etch stations, requiring no modification to the existing etch stations.

IMPLEMENTATION

The fixture 10 of the present invention was retro-fit into an automated wet etch tool for end point detection and process control. Aluminum oxide was etched from patterned wafers in a hot phosphoric acid (at 75° C.). All fixture parts were constructed of Teflon except for the rods, electrodes, and wires. Low sodium quartz rods were used. The electrodes were each constructed of a rectangular platinum sheet welded to a respective platinum wire. The platinum wires were sheathed with heat shrink Teflon tubing from the electrode to the terminal ends distant from the etchant bath. The fixture 10 was locked into the bottom of the etch tank with tight fitting Teflon braces.

Figure 5:
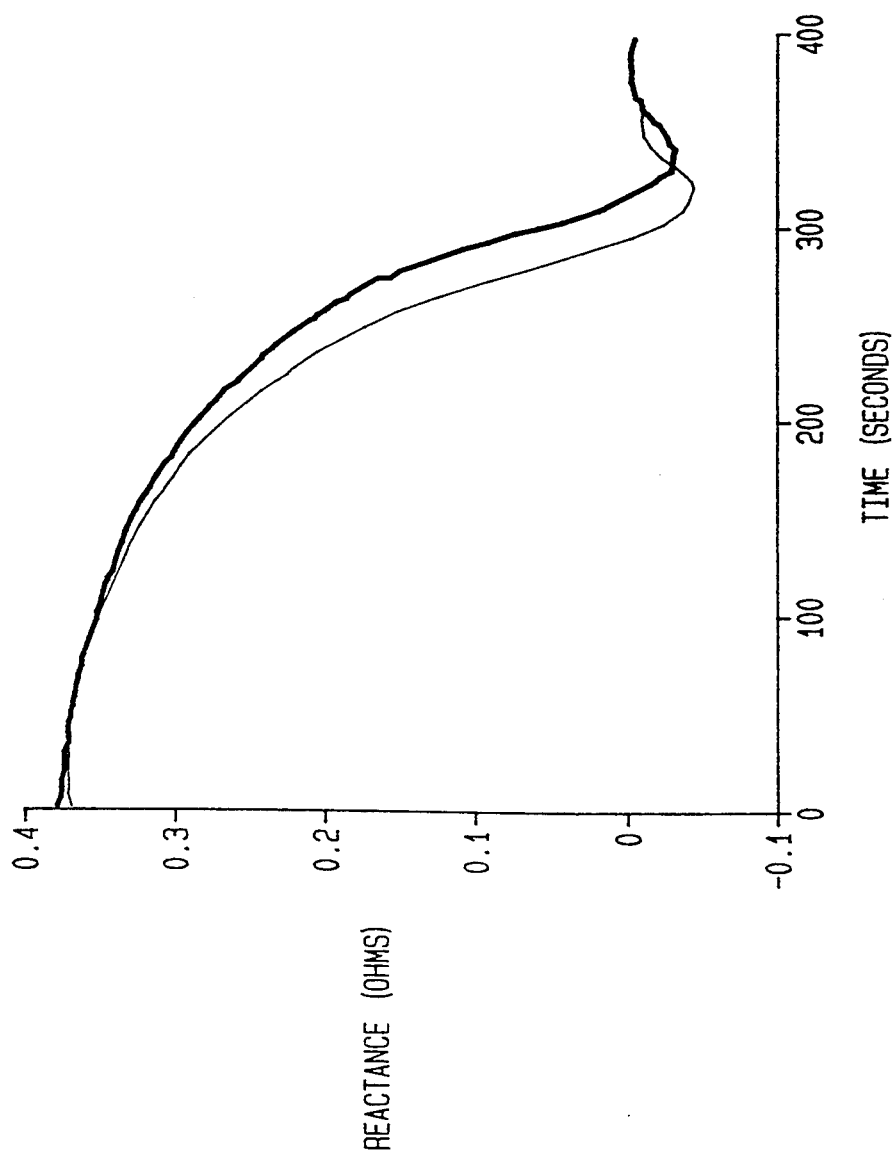
FIG. 5 shows a graph of representative monitored electrical characteristics of the etching of two wafers at separate runs in different etchant bath temperatures.

The fixture 10 was then used in a completely automated fashion. Wafer carriers holding one or more wafers were placed into and removed from the fixture by the etch tool robot arm in a normal fashion. No additional automated or human intervention was required. FIG. 5 shows two observed records of impedance spectra (impedance vs. time) for wafers etched in the aforementioned etch tool having the fixture 10 of the present in place. Note that it is important that only the wafer in the first slot of the wafer carrier be maintained fixed during an etching operation. The remainder of wafers in the wafer carrier need not be fixed.

The present invention thus advantageously provides a retro-fittable fixture compatible with robotics, having passive, reproducible and safe wafer restraint. Such a fixture further advantageously provides automated establishment of a desired orientation and positioning of monitor electrodes to a wafer being etched during chemical etch process monitoring. That is, fixture 10 provides automatic, repeatable desired spacing between the electrodes and the wafer being monitored during an etching process.

Thus there has been shown a fixture well suited for use in real-time in-situ monitoring of an etching characteristic of an etching process. Such a fixture is relatively inexpensive to implement and advantageously ensures the repeatability and integrity of the monitoring of the etched wafer or wafers. In addition, the repeatability of the electrode to wafer spacing is accurately and precisely maintained. Furthermore, fixture 10 advantageously provides for the passive self-locking of a first wafer contained in the wafer carrier. Fixture 10 is readily adaptable for implementation in existing etch stations. Automated etch processing a wafer can now be more precisely and repeatably controlled.

While the invention has been particularly shown and described with reference to the preferred embodiment thereof, it will be understood by those skilled in the art that various changes in form and detail may be made therein without departing from the spirit and scope of the invention. For instance, suitable means may be provide for making adjustments to secure fixture 10 within an etchant tank.

What is claimed is:

1. A fixture for in-situ chemical etch monitoring of an etching process during etching of at least one wafer contained in a wafer carrier, one of the at least one wafers being positioned in a first slot of the wafer carrier, said fixture comprising:
   a) a set of primary guide members for engaging and guiding a front portion of the wafer carrier;
   b) a set of rear guide members for engaging and guiding a rear portion of the wafer carrier;

c) a set of electrode arms for receiving a respective electrode and corresponding electrode wire thereon;
d) a mounting plate for establishing spacing of said set of primary guide members with respect to said set of electrode arms;
e) a means for self-locking the first wafer contained in the wafer carrier, said self-locking means connected to said mounting plate and further positioned in a manner with respect to said set of primary guide members and said set of electrode arms; and
f) means for connecting said mounting plate, said set of primary guide members, said set of electrode arms to said set of rear guide members, whereby insertion of the wafer carrier into the fixture establishes a distance between the set of electrode arms and the first wafer, and further wherein the first wafer is passively fixed by said self-locking means.

* * * * *